United States Patent
Uchida et al.

(10) Patent No.: US 6,614,712 B2
(45) Date of Patent: Sep. 2, 2003

(54) SEMICONDUCTOR MEMORY DEVICE

(75) Inventors: Toshiya Uchida, Kawasaki (JP); Kota Hara, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/329,669

(22) Filed: Dec. 27, 2002

(65) Prior Publication Data

US 2003/0095466 A1 May 22, 2003

Related U.S. Application Data

(62) Division of application No. 09/789,514, filed on Feb. 22, 2001, now Pat. No. 6,529,439.

(30) Foreign Application Priority Data

Feb. 24, 2000 (JP) ........................................ 2000-047116

(51) Int. Cl.[7] .................................................. G11C 8/00
(52) U.S. Cl. ............................. 365/230.06; 365/189.11
(58) Field of Search ....................... 365/230.06, 189.11, 365/230.01, 189.01

(56) References Cited

U.S. PATENT DOCUMENTS

| | | | | |
|---|---|---|---|---|
| 5,835,441 | A | 11/1998 | Seyyedy et al. | 365/230.06 |
| 5,953,282 | A | 9/1999 | Jung et al. | 365/230.05 |
| 5,982,701 | A | * 11/1999 | Eto | 365/230.06 |
| 6,147,925 | A | 11/2000 | Tomishima et al. | 365/230.03 |
| 6,236,605 | B1 | * 5/2001 | Mori et al. | 365/205 |
| 6,249,477 | B1 | * 6/2001 | Ohtsuki | 365/230.06 |

* cited by examiner

*Primary Examiner*—Hoai Ho
(74) *Attorney, Agent, or Firm*—Arent Fox Kintner Plotkin & Kahn, PLLC

(57) ABSTRACT

A semiconductor memory device includes isolation circuits disconnecting cell arrays from sense amplifiers, and isolation signal generating circuits generating isolation signals that control the isolation circuits. The isolation signal generating circuits are hierarchically divided into main isolation signal generating circuits and sub isolation signal generating circuits. The sub isolation signal generating circuits generate sub isolation signals having a first potential on a high-potential side. The main isolation signal generating circuits generate main isolation signals having a second potential on the high-potential side, the second potential being lower than the first potential.

1 Claim, 13 Drawing Sheets

- ▦ ····· ACTIVATED
- ▨ ····· ISOLATION CIRCUIT IN WHICH ISOLATION TRANSISTORS ARE OFF
- ☐ ····· ISOLATION CIRCUIT IN WHICH ISOLATION TRANSISTORS ARE ON

▒ ····· ACTIVATED

▨ ··· ISOLATION CIRCUIT IN WHICH ISOLATION TRANSISTORS ARE OFF

☐ ··· ISOLATION CIRCUIT IN WHICH ISOLATION TRANSISTORS ARE ON

FIG.6

| | | | | | |
|---|---|---|---|---|---|
| MS-CROSS 211 | MS-CROSS 212 | | MS-CROSS 213 | | |
| mwdec area 197 | mwdec area 198 | | | | |
| SS-CROSS 215 | SS-CROSS 218 | | SS-CROSS 221 | | |
| swdec area 199 | swdec area 202 | | | | |
| Cell area 193 | Cell area 195 | | | | |
| swdec area 200 | swdec area 203 | | | | |
| Sense amp area 205 | Sense amp area 207 | ... | Sense amp area 209 | | |
| SS-CROSS 216 | SS-CROSS 219 | | SS-CROSS 222 | | |
| Cell area 194 | Cell area 196 | | | | |
| swdec area 201 | swdec area 204 | | | | |
| Sense amp area 206 | Sense amp area 208 | | Sense amp area 210 | | |
| SS-CROSS 217 | SS-CROSS 220 | | SS-CROSS 223 | | |

192

------→ SIGNAL LINE OF VII LEVEL

———→ SIGNAL LINE OF VPP LEVEL

- - - - - - → SIGNAL LINE OF VII LEVEL
⎯⎯⎯⎯→ SIGNAL LINE OF VPP LEVEL

SEMICONDUCTOR MEMORY DEVICE

This is a Division of application Ser. No. 09/789,514 filed Feb. 22, 2001, (which in turn is a Continuation Application of U.S. Pat. No. 6,529,439). The disclosure of the prior application(s) is hereby incorporated by reference herein in its entirety.

BACKGROUND OF THE INVENTION

1. Field of the Invention

The present invention generally relates to semiconductor memory devices, and more particularly, to a semiconductor memory device equipped with an isolation signal generating circuit for controlling electrical isolation between a cell array and a sense amplifier. The present invention is also concerned with a semiconductor memory device of a hierarchical arrangement of word drivers for driving word lines.

2. Description of the Related Art

First, a first conventional semiconductor memory device will be described with reference to FIGS. 1 and 2.

FIG. 1 is a circuit diagram of a part of a DRAM (Dynamic Random Access Memory), which is the first conventional semiconductor memory device. The DRAM shown in FIG. 1 employs a shared sense amplifier formation in which a sense amplifier is shared by neighboring cell arrays. The DRAM also employs a hierarchical arrangement of word drivers so that each word driver includes a main word driver and a sub word driver.

The DRAM includes cell arrays 1–9, main word drivers 10–12, and sub word drivers 13–24. The main word drivers 10–12 drive main word lines. The sub word drivers receive output signals of the main word drivers 10–12 and sub word selection signals that are output by a sub word selection signal generating circuit (not illustrated for the sake of simplicity), and select involved memory cells.

Column decoders 25–27 decode a column address signal and select columns based on decoding. Sense amplifier parts 28–39 are shared by neighboring cell arrays in a wiring direction of bit lines, and include a sense amplifier and a bit line precharge circuit.

The DRAM includes row block selecting signal lines 40–45, and a timing signal line 46. The DRAM includes isolation signal generating circuits 47–52, which receive the row block selecting signals and a timing signal, and thus generate isolation signals for controlling electrical connection/disconnection between the neighboring cell arrays and the sense amplifier parts in the direction in which the bit lines run.

The DRAM includes isolation signal lines 53–58, and isolation circuits 59–76. The isolation signal lines 53–58 carry isolation signals respectively output by the isolation signal generating circuits 47–52. The isolation circuits 59–76 respectively have, as switching elements, isolation transistors, which are turned ON/OFF by the isolation signals in order to control electrical connection and disconnection between the cell arrays and sense amplifiers which are adjacent in the direction in which the bit lines run.

In the DRAM thus configured, a read/write operation enables the cell arrays connected to selected main word lines, sub word drivers and sense amplifier parts associated with the selected main word lines. Further, the isolation transistors of the isolation circuits involved in the above read/write operation.

FIG. 2 is a circuit diagram illustrating an isolation operation performed in the DRAM that is described as the first conventional semiconductor memory device in the present specification. For example, when the word lines driven by the main word driver 11 are selected, the cell arrays 4–6, the sub word drivers 17–20, and the sense amplifier parts 31–36 are enabled within the circuit part shown in FIG. 2, while the isolation transistors of the isolation circuits 62–64 and 71–73 are turned OFF. The isolation transistors of the isolation circuits 59–61, 65–70, and 74–76 are maintained in the ON state.

Thus, electrical connections are made between the cell array 4 and the sense amplifier parts 31 and 34, between the cell array 5 and the sense amplifier parts 32 and 35, and between the cell array 6 and the sense amplifier parts 33 and 36. In contrast, the cell arrays 1, 2, 3, 7, 8 and 9 are respectively disconnected from the sense amplifier parts 31, 32, 33, 34, 35 and 36.

A description will be given, with reference to FIGS. 3 through 5, of a second conventional DRAM, which employs the shared amplifier formation. The DRAM also employs a hierarchical arrangement of word drivers so that each word driver includes a main word driver and a sub word driver. Further, each isolation signal generating circuit is hierarchically arranged so as to include a main isolation signal generating circuit and a sub isolation signal generating circuit.

Referring to FIG. 3, the second conventional DRAM includes row block selection signal lines 77–82, a timing signal line 83, main isolation signal generating circuits 84–89, and main isolation signal lines 90–95. The main isolation signal generating circuits 84–89 receive the row block selection signal lines 77–82 and a timing signal carried over the timing signal line 83, and generate resultant main isolation signals, which are transferred over the main isolation signal lines 90–95.

The second conventional DRAM includes column block selection signal lines 96–101, sub isolation signal generating circuits 102–137, and sub isolation signal lines 138–155. The sub isolation signal generating circuits 102–137 receive the main isolation signals and column block selection signals carried over the column block selection signal lines 96–101, and generate resultant sub isolation signals, which are transferred over the sub isolation signal lines 138–155.

The second conventional DRAM includes sub word drivers 156–173, and has the same cell arrays 1–9, main word drivers 10–12, column decoders 25–27, the sense amplifier parts 28–39, and isolation circuits 59–76 as those of the first conventional DRAM.

In the second conventional DRAM, a read/write operation enables the cell arrays connected to selected main word lines, sub word drivers and sense amplifier parts associated with the selected main word lines. Further, the isolation transistors of the isolation circuits involved in the above read/write operation.

FIG. 4 is a circuit diagram illustrating an isolation operation performed in the second conventional. For example, when memory cells in the cell array 5 are selected, the cell array 5, the sub word drivers 164 and 165, the sub isolation signal generating circuits 110, 111, 128 and 129, and the sense amplifier parts 32 and 35 are enabled within the circuit part shown in FIG. 4.

Thus, the isolation transistors of the isolation circuits 63 and 72 are turned OFF, while those of the isolation circuits 59–62, 64–71, and 73–76 are maintained in the ON state. Thus, connections of the cell array 5 with the sense amplifier parts 32 and 35 are made, while the cell arrays 2 and 8 are disconnected from the sense amplifier parts 32 and 35, respectively.

FIG. 5 is a circuit diagram of a configuration of the main isolation signal generating circuits and the sub isolation signal generating circuits employed in the second conventional DRAM. A main isolation signal generating circuit 174 includes a NAND circuit 175, an inverter 176, PMOS (P-channel Metal Oxide Semiconductor) transistors 177–179, and NMOS (N-channel MOS) transistors 180–182.

A sub isolation signal generating circuit 183 includes PMOS transistors 184–187, and NMOS transistors 188–191. A symbol VPP denotes a boosted voltage obtained by boosting a power supply voltage supplied from the outside of the DRAM. A symbol VSS denotes a ground potential.

A description will be given, with reference to FIGS. 6 through 8, of a third conventional DRAM.

FIG. 6 illustrates a layout of a core part of the third conventional DRAM, which employs the shared sense amplifier formation and the hierarchical arrangements of the word drivers and isolation signal generating circuits. Further, the third conventional DRAM includes a hierarchical arrangement of sub word selection signal generating circuits (¼ signal generating circuits) so that each of the circuits is made up of a main sub-word selection signal generating circuit (main ¼ signal generating circuit) and a sub sub-word selection signal generating circuit (sub ¼ signal generating circuit).

The layout shown in FIG. 6 includes a core part 192, cell areas 193–196, main word driver areas 197 and 198, sub word driver areas 199–204, sense amplifier areas 205–210, MS cross areas 211–213, and SS cross areas 215–223. The cell areas 193–196 include cell arrays. The main word driver areas 197 and 198 include main word drivers. The sub word driver areas 199–204 include sub word drivers. The sense amplifier areas 205–210 include sense amplifiers. The MS cross areas 211–213 include main sub-word selection signal generating circuits and main isolation signal generating circuits. The SS cross areas 215–223 include sub sub-word selection signal generating circuits, sub isolation signal generating circuits, and bit line precharge signal generating circuits.

FIG. 7 is a circuit diagram of a part of the core part of the third conventional DRAM. There are illustrated address signal lines 224, main word drivers 225–227, sub word drivers 228–247, main sub-word selection signal generating circuits 248–251, sub sub-word selection signal generating circuits 252–259, main isolation signal generating circuits 260 and 261, sub isolation signal generating circuits 262–265, and bit line precharge signal generating circuits 266 and 267.

Arrows of broken lines denote signal lines that carry a signal. This signal has an amplitude having the maximum level (corresponding to a power supply potential on the high-potential side) corresponding to a step-down voltage VII obtained by internally stepping down the power supply voltage VDD supplied from the outside of the DRAM, and the minimum level (corresponding to a power supply potential on the low-potential side) corresponding to the ground potential VSS. Arrows of solid lines denote signal lines that carry the following signal. This signal has an amplitude having the maximum level (corresponding to a power supply potential on the high-potential side) corresponding to the boosted voltage VPP, and the minimum level (low-potential) corresponding to the ground level VSS.

More particularly, the address signal lines 224 described by broken-line arrows carry the step-down potential VII that is the power supply potential on the high-potential side and is obtained by stepping down the external power supply voltage VDD. The following signal lines by solid-line arrows carry the boosted potential VPP that is the power supply potential on the low-potential side: the main word lines extending from the main word drivers 225–227, the main sub-word selection signal lines extending from the main sub-word selection signal generating circuits 248–251, the main isolation signal lines extending from the main isolation signal generating circuits 260 and 261, the sub isolation signal lines extending from the sub isolation signal generating circuits 262–265, and bit line precharge signal lines extending from the bit line precharge signal generating circuits 266 and 267.

FIG. 8 is a circuit diagram of a circuit configuration arranged in the SS cross area in the core part of the third conventional DRAM. Referring to FIG. 8, there are illustrated sub isolation signal generating circuits 268 and 269, each of which circuit includes PMOS transistors 270 and 271, NMOS transistors 272 and 273, and inverters 274 and 275. There are also illustrated a bit line precharge signal generating circuit 276 composed of a NOR circuit 277 and an inverter 278. A sub sub-word selection signal generating circuit 279 is made up of a PMOS transistor 280, NMOS transistors 281 and 282, and inverters 283–285. A sub word driver 286 is made up of PMOS transistor 287 and NMOS transistors 288 and 289.

However, the second conventional DRAM shown in FIG. 3 has a disadvantage in that the boosted potential VPP is used as the power supply potential of the main isolation signals on the high-potential side and the sub isolation signals. This consumes an increased amount of power.

The third conventional DRAM shown in FIG. 7 (FIG. 6) has a disadvantage in that the potential VPP is used as the power supply potential of the main sub-word selection signals on the high-potential side and sub sub-word selection signals. This increases power consumption.

SUMMARY OF THE INVENTION

It is a general object of the present invention to provide a semiconductor memory device in which the above disadvantages are eliminated.

A more specific object of the present invention is to provide a semiconductor memory device equipped with a hierarchical arrangement of isolation circuits controlling electrical isolation between cell arrays and sense amplifiers, wherein reduced power can be consumed.

Another object of the present invention is to provide a semiconductor memory device equipped with a hierarchical arrangement of sub word selection signal generating circuits, wherein reduced power can be consumed.

The above objects of the present invention are achieved by a semiconductor memory device comprising: isolation circuits disconnecting cell arrays from sense amplifiers; and isolation signal generating circuits generating isolation signals that control the isolation circuits, the isolation signal generating circuits being hierarchically divided into main isolation signal generating circuits and sub isolation signal generating circuits, the sub isolation signal generating circuits generating sub isolation signals having a first potential on a high-potential side, the main isolation signal generating circuits generating main isolation signals having a second potential on the high-potential side, the second potential being lower than the first potential.

According to the above semiconductor memory device, the potential of only the sub isolation signals on the high-potential side is the first potential, while the potential of the main isolation signals on the high potential side is the second potential lower than the first potential. It is therefore possible to reduce the number of signal lines via which the first potential serving as a high-potential side power supply potential is supplied.

The above objects of the present invention are also achieved by a semiconductor memory device comprising: main word drivers that drive word lines and are hierarchically divided into main word drivers and sub word drivers; and sub word selection signal generating circuits that select sub word lines and are hierarchically divided into main sub-word selection signal generating circuits and sub sub-word selection signal generating circuits, the sub sub-word selection signal generating circuits generating sub sub-word selection signals having a first potential on a high-potential side, the main sub-word selection signal generating circuits generating main sub-word selection signals having a second potential on the high-potential side, the second potential being lower than the first potential.

According to the above semiconductor memory device, the potential of only the sub sub-word selection signals on the high-potential side is the first potential, while the potential of the main sub-word selection signals on the high-potential side is the second potential lower than the first potential. It is therefore possible to reduce the number of signal lines via which the first potential serving as a high-potential side power supply potential is supplied.

BRIEF DESCRIPTION OF THE DRAWINGS

Other objects, features and advantages of the present invention will become more apparent from the following detailed description when read in conjunction with the accompanying drawings, in which:

FIG. 6 is a diagram of a layout of a core part of a third conventional DRAM;

DESCRIPTION OF THE PREFERRED EMBODIMENTS

A description will be given, with reference to FIGS. 9 through 11, of a first embodiment of the present invention.

Figure 9:
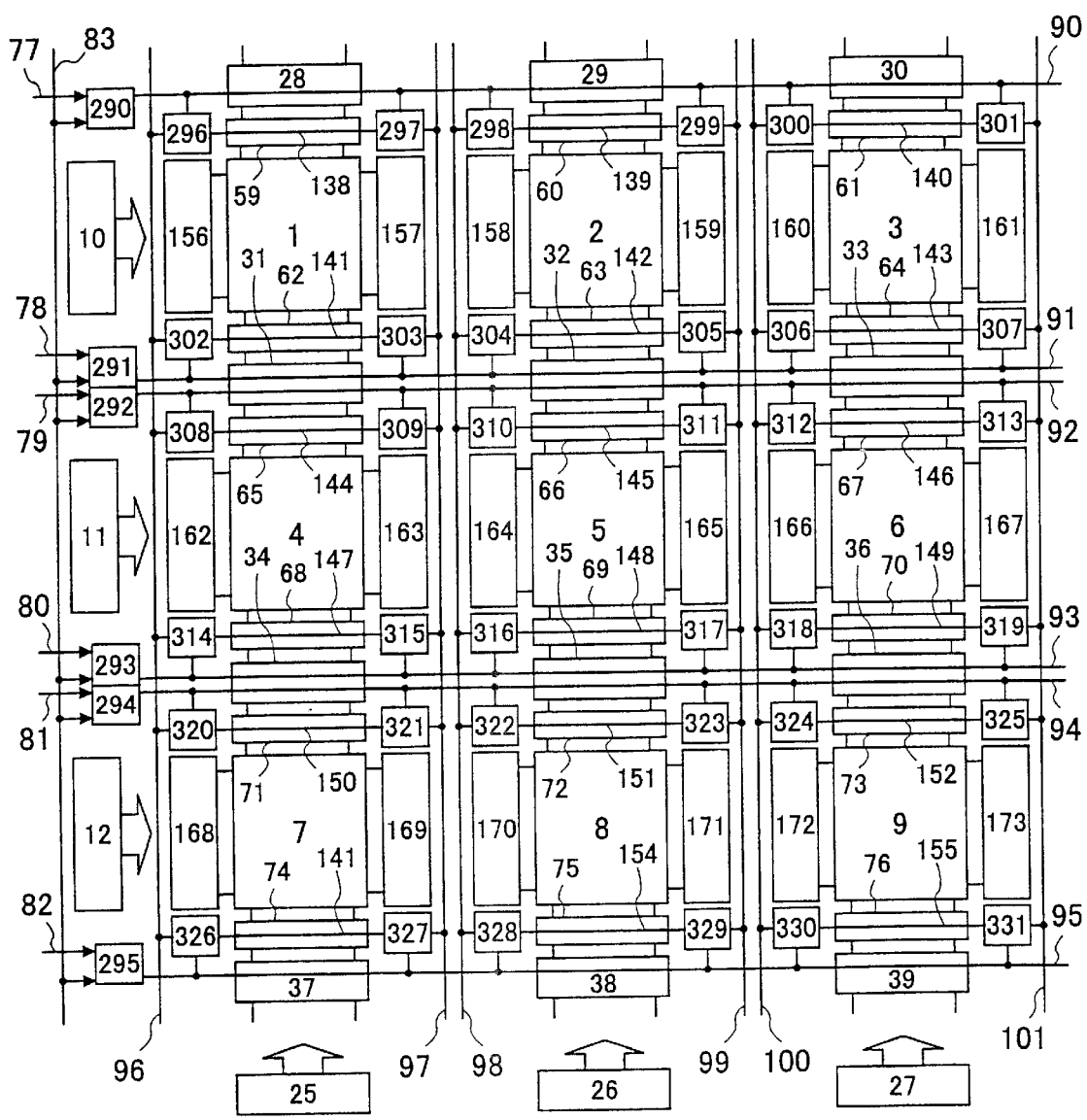
FIG. 9 is a circuit diagram of a first embodiment of the present invention.

FIG. 9 is a circuit diagram of a DRAM according to a first embodiment of the present invention. The DRAM includes main isolation signal generating circuits 290–295 having different circuit configurations from those of the main isolation signal generating circuits 84–89. The DRAM also includes sub isolation signal generating circuits 296–331 having different circuit configurations from those of the sub isolation signal generating circuits 102–137.

Figure 1:
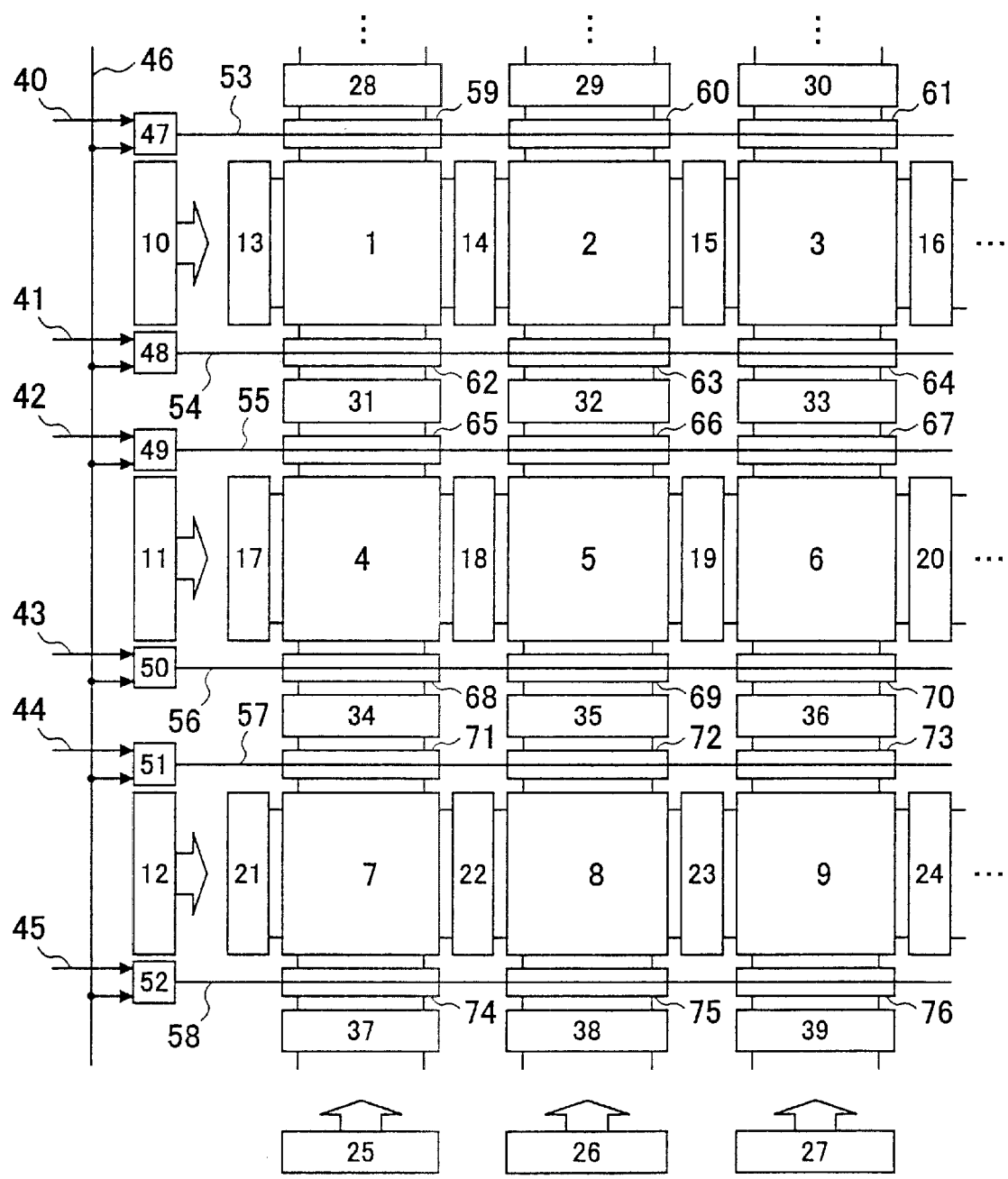
FIG. 1 is a circuit diagram of a part of a first conventional DRAM.
Figure 2:
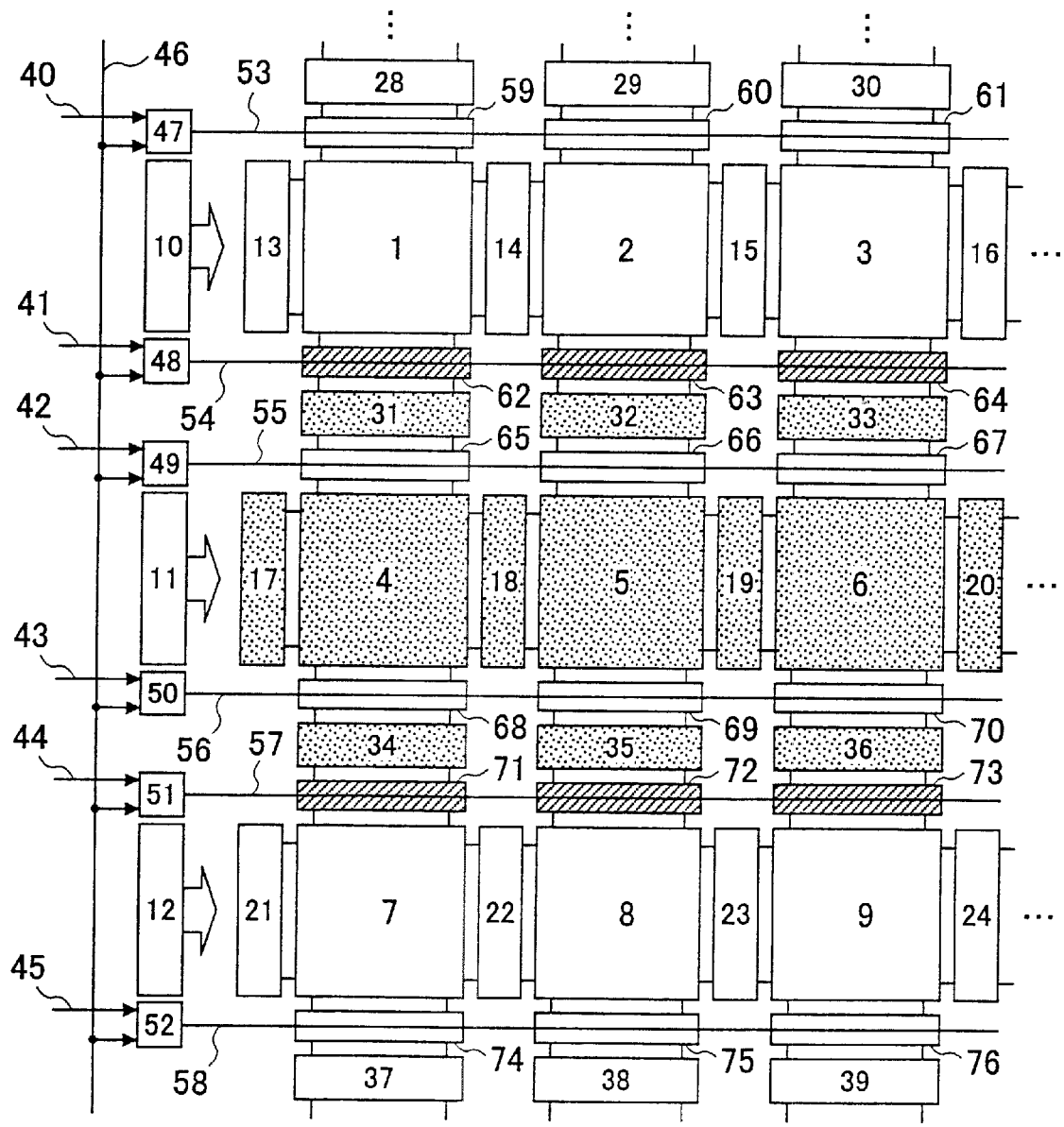
FIG. 2 is a circuit diagram for explaining an isolating operation of the first conventional DRAM.
Figure 3:
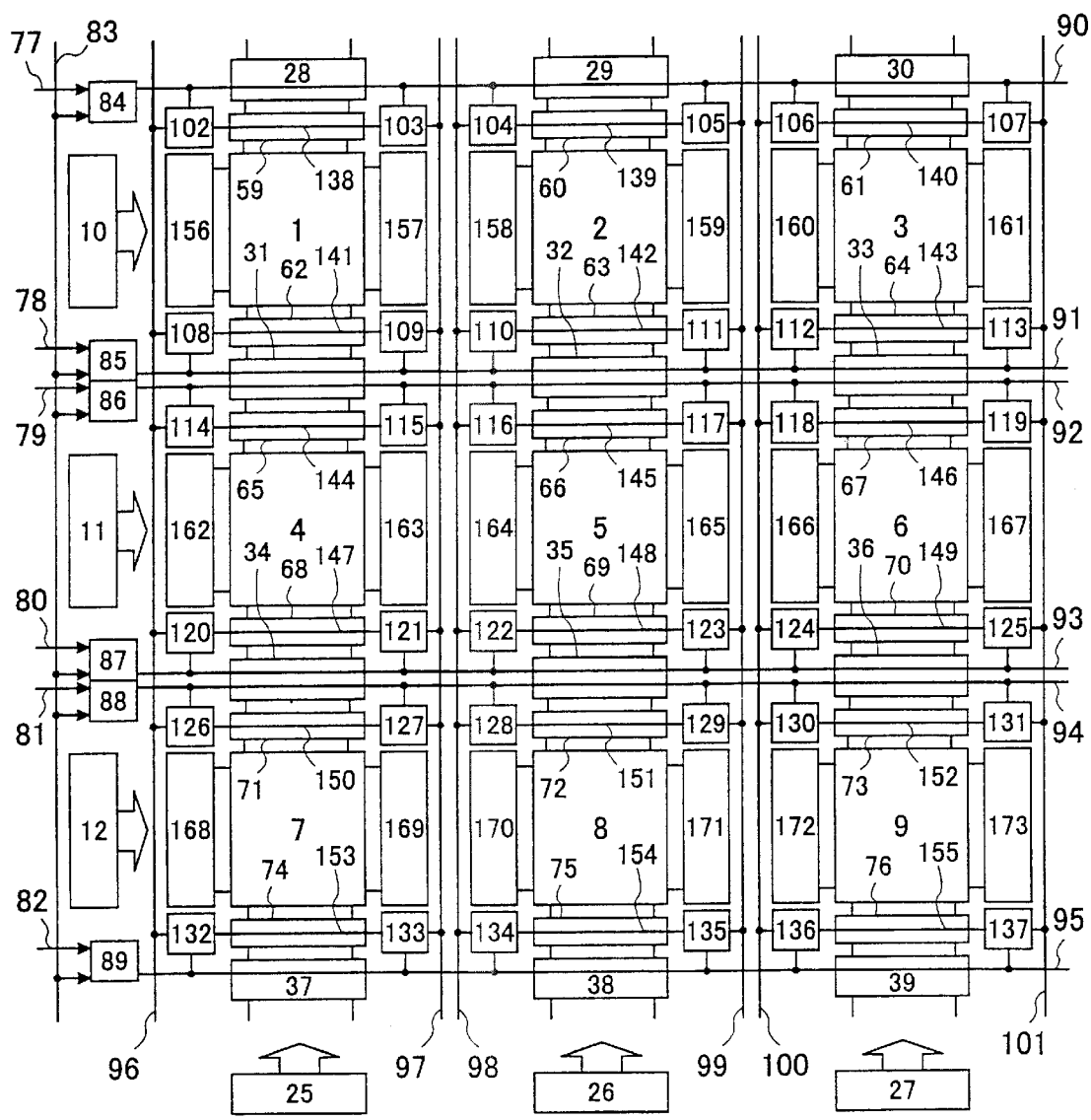
FIG. 3 is a circuit diagram of a second conventional DRAM.
Figure 4:
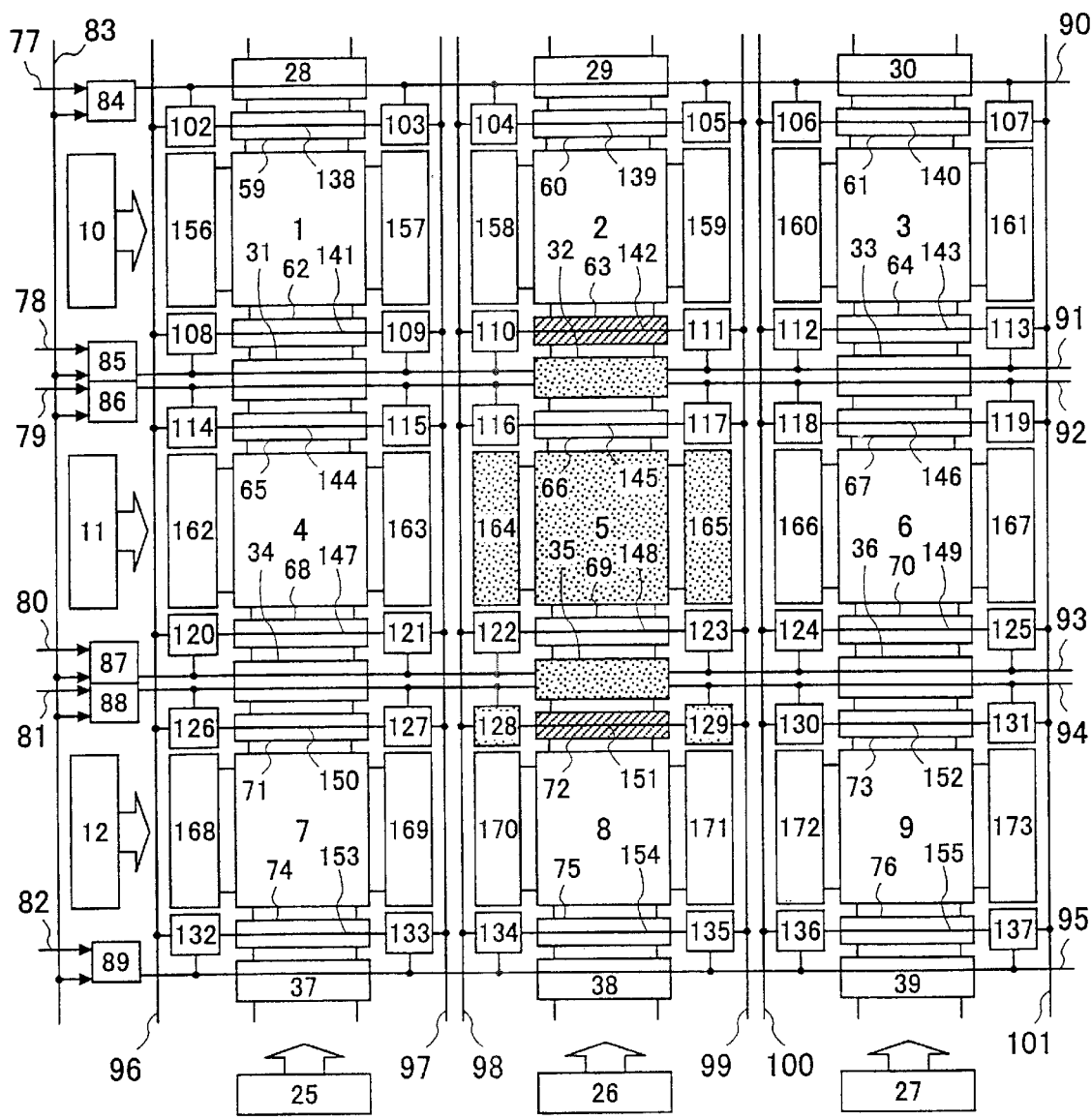
FIG. 4 is a circuit diagram for explaining an isolating operation of the second conventional DRAM.
Figure 5:
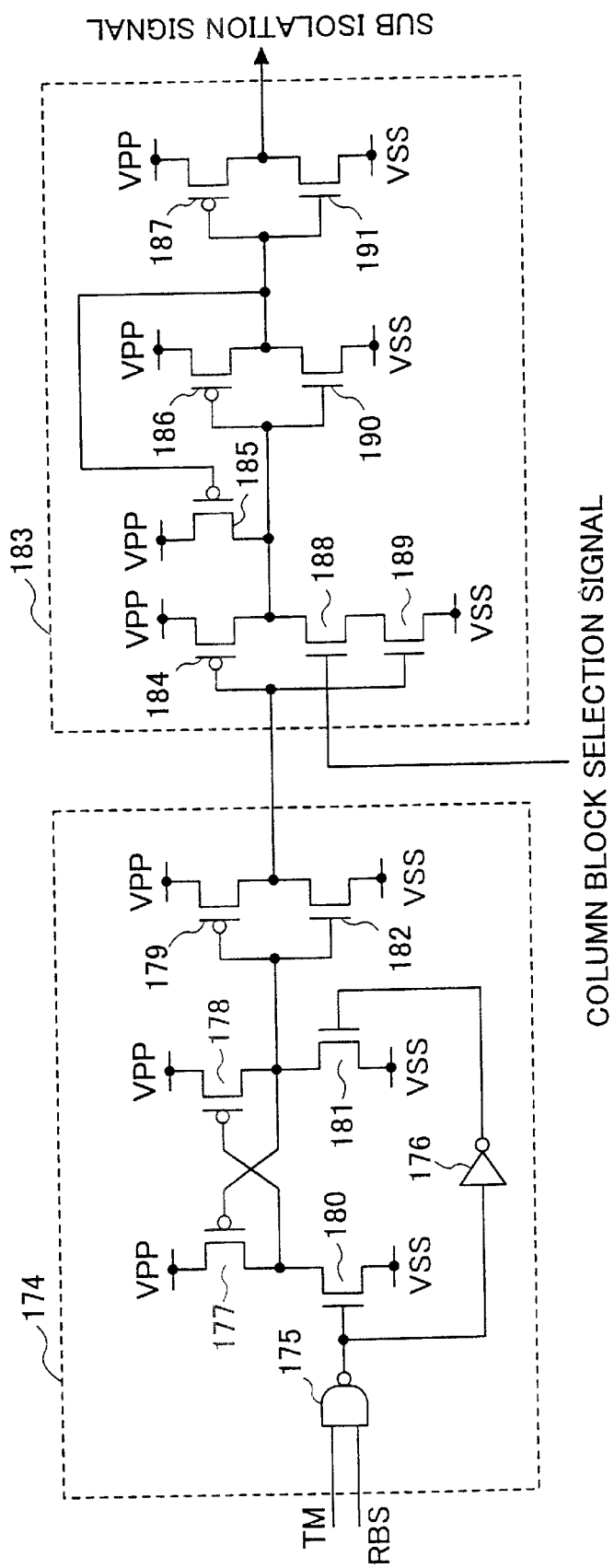
FIG. 5 is a circuit diagram of a main isolation signal generating circuit and a sub isolation signal generating circuit, both being provided in the second conventional DRAM.

That is, the DRAM according to the first embodiment of the present invention is provided newly with main isolation signal generating circuits 290–295 configured differently from those shown in FIG. 3 and sub isolation signal generating circuits 296–331 configured differently from those shown in FIG. 3. The other parts of the DRAM according to the first embodiment of the present invention are configured in the same manner as those of the DRAM shown in FIG. 3.

In the first embodiment of the present invention, the main isolation signal generating circuits 290–295 are configured in such a way as to generate a main isolation signal that swings between the external power supply potential VDD (or the step-down power supply potential VII) and the ground potential VSS. The sub isolation signal generating circuits 296–331 are configured in such a way as to generate a sub isolation signal that swings between the boosted power supply potential VPP and the ground potential VSS.

Figure 10:
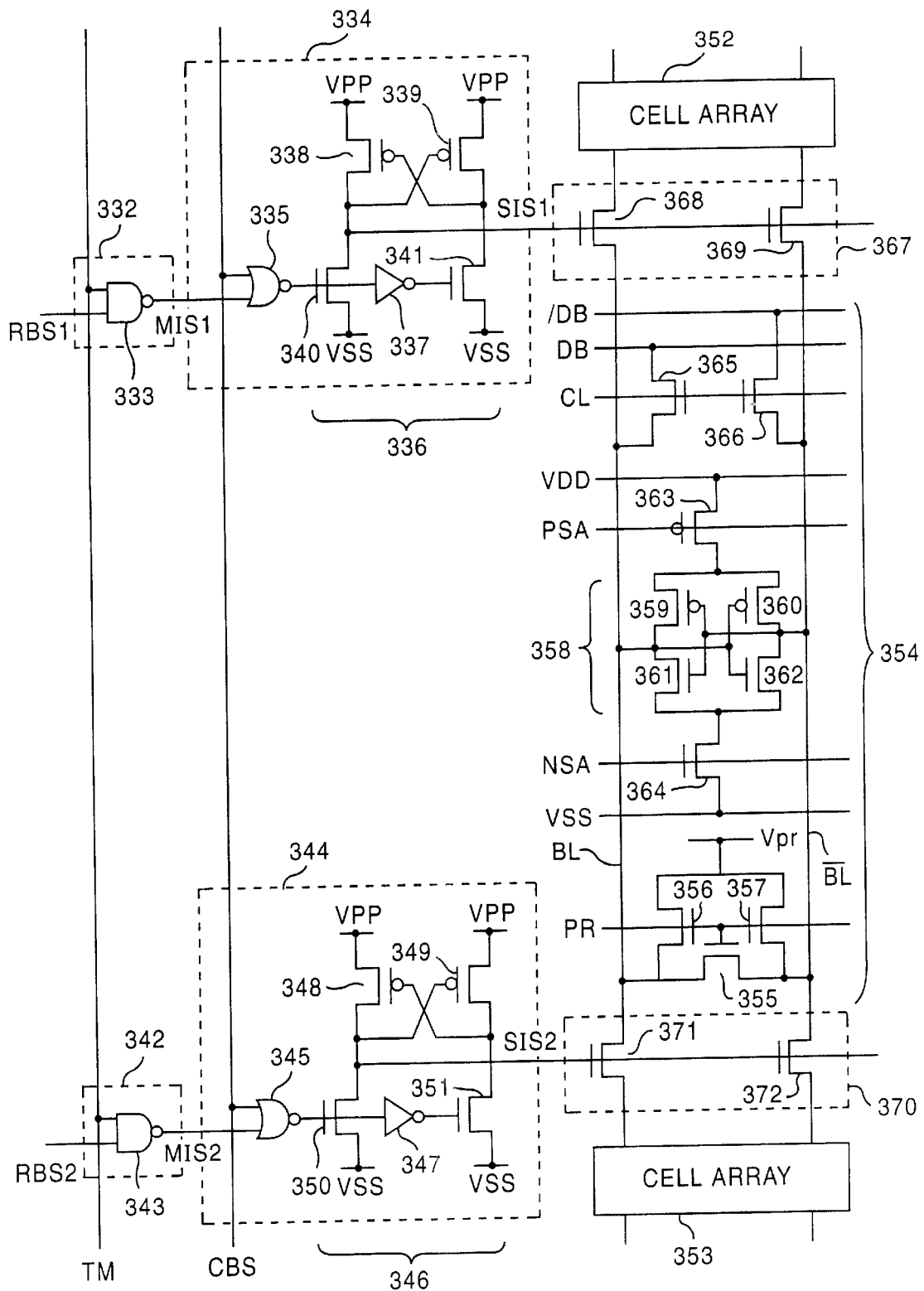
FIG. 10 is a circuit diagram of a circuit configuration of a main isolation signal generating circuit and a sub isolation signal generating circuit, both being provided in the first embodiment of the present invention.

FIG. 10 is a circuit diagram of a circuit configuration of the main isolation signal generating circuits and the sub isolation signal generating circuits employed in the first embodiment of the present invention. Referring to FIG. 10, there is illustrated a main isolation signal generating circuit 332, which includes a NAND circuit 333. The main isolation signal generating circuit 332 receives a row block selection signal RBS1 and a timing signal TM, and generates a main isolation signal MIS1 therefrom. The NAND circuit 333 has a CMOS structure in which the power supply potential VII (that may be VDD) and the ground potential VSS serve as the power supply potentials on the high-potential and low-potential sides, respectively.

The DRAM includes a sub isolation signal generating circuit 334, which receives the main isolation signal MIS1 and a column block selection signal CBS, and generates a sub isolation signal SIS1. The circuit 334 includes a logic circuit of a NOR circuit, which performs a NOR operation on the main isolation signal MIS1 and the column block selection signal CBS. The NOR circuit has a CMOS structure in which the power supply potential VII and the ground potential VSS serve as the power supply potentials on the high-potential and low-potential sides, respectively.

The DRAM includes a level conversion circuit 336, which converts the level of the output of the NOR circuit 335 to thus produce the sub isolation signal SIS1. The circuit 336 includes an inverter 337 that inverts the output of the NOR circuit 335, PMOS transistors 338 and 339, and NMOS transistors 340 and 341. The inverter 337 is a CMOS structure, which receives the power supply potential VII on the high-potential side and the ground potential VSS on the low-potential side. The sources of the PMOS transistors 338 and 339 are connected to a VPP line via which the boosted potential VPP is supplied.

A main isolation signal generating circuit 342 receives a row block selection signal RBS2 and the timing signal TM, and thus generates a main isolation signal MIS2. The circuit 342 includes a NAND circuit 343 of a CMOS structure, which receives the power supply potential VII on the high-potential side and the ground potential VSS on the low-potential side.

A sub isolation signal generating circuit 344 receives the main isolation signal MIS2 and the column block selection signal CBS, and thus generates a sub isolation signal SIS2. A NOR circuit 345 performs a NOR operation on the main isolation signal MIS2 and the column block selection signal CBS. The NOR circuit 345 has a CMOS structure, which receives the power supply potential VII on the high-potential side and the ground potential VSS on the low-potential side.

A level conversion circuit 346 converts the output of the NOR circuit 345 to thus produce the sub isolation signal SIS2. The circuit 346 includes an inverter 347 inverting the output of the NOR circuit 345, PMOS transistors 348 and 349, and NMOS transistors 350 and 351. The inverter 347 has a CMOS structure, which receives the power supply potential VII on the high-potential side and the ground potential VSS on the low-potential side. The sources of the PMOS transistors 348 and 349 are connected to the VPP line via which the boosted potential VPP is supplied.

The DRAM includes cell arrays 352 and 353, and a sense amplifier part that is shared by the cell arrays 352 and 353. NMOS transistors 355 through 357 form a bit line precharge circuit that precharges the bit lines BL and /BL to a precharge potential Vpr. A symbol PR is a bit line precharge signal, which controls ON/OFF of the NMOS transistors 355 through 357.

A sense amplifier 358 includes PMOS transistors 359 and 360 and NMOS transistors 361 and 362. A PMOS transistor 363 is turned ON/OFF by a sense amplifier driving signal PSA, and supplies the sense amplifier 358 with the power supply potential VII. An NMOS transistor is turned ON/OFF by another sense amplifier driving signal NSA, and supplies the sense amplifier 358 with the ground potential VSS.

NMOS transistors 365 and 366 are NMOS transistors that forms a column selection circuit. A symbol CL is a column selection signal, which controls ON/OFF of the NMOS transistors 365 and 366. Symbols DB and /DB are data bus lines.

An isolation circuit 367 includes NMOS transistors 368 and 369 serving as isolation transistors that are turned ON/OFF by the sub isolation signal SIS1. An isolation circuit 370 includes NMOS transistors 371 and 372 serving as isolation transistors that are turned ON/OFF by the sub isolation signal SIS2.

When the cell array 352 is activated, the row block selection signal RBS1 and RBS2 are respectively set at VSS and VII, and the timing signal TM is set at VII, the column block signal CBS being set at VSS.

Thus, the main isolation signal MIS1 is set at VII and the sub isolation signal generating circuit 334 operates as follows: the output of the NOR circuit 335 is equal to VSS; the output of the inverter 337 is VII; the NMOS transistor 340 is OFF; the NMOS transistor 341 is ON; the PMOS transistor 338 is ON; the PMOS transistor 339 is OFF; and the sub isolation signal SIS1 becomes equal to VPP. The NMOS transistors 368 and 369 in the isolation circuit 367 are turned ON.

The main isolation signal MIS2 is set at VSS, and the sub isolation signal generating circuit 344 operates as follows: the output of the NOR circuit 345 is VII; the output of the inverter 347 is VSS; the NMOS transistor 350 is ON; the NMOS transistor 351 is OFF; the PMOS transistor 348 is OFF; the PMOS transistor 349 is ON; and the sub isolation signal SIS2 becomes equal to VSS. The NMOS transistors 371 and 372 in the isolation circuit 370 are turned OFF. As a result of the operation, the cell array 352 and the sense amplifier part 354 are electrically isolated, and the cell array 353 and the sense amplifier part 354 are electrically isolated.

In contrast, when the cell array 353 is activated, the row block selection signals RBS1 and RBS2 are respectively set at VII and VSS, and the timing signal TM is set at VII, the column selection signal CBS being set at VSS.

Thus, the main isolation signal MIS1 is set at VSS and the sub isolation signal generating circuit 334 operates as follows: the output of the NOR circuit 335 is equal to VII; the output of the inverter 337 is VSS; the NMOS transistor 340 is ON; the NMOS transistor 341 is OFF; the PMOS transistor 338 is OFF; the PMOS transistor 339 is ON; and the sub isolation signal SIS1 becomes equal to VSS. The NMOS transistors 368 and 369 in the isolation circuit 367 are turned OFF.

The main isolation signal MIS2 is set at VII, and the sub isolation signal generating circuit 344 operates as follows: the output of the NOR circuit 345 is VSS; the output of the inverter 347 is VII; the NMOS transistor 350 is OFF; the NMOS transistor 351 is ON; the PMOS transistor 348 is ON; the PMOS transistor 349 is OFF; and the sub isolation signal SIS2 becomes equal to VPP. The NMOS transistors 371 and 372 in the isolation circuit 370 are turned ON. As a result of the operation, the cell array 353 and the sense amplifier part 354 are electrically connected, while the cell array 352 and the sense amplifier part 354 are electrically isolated.

Figure 11:
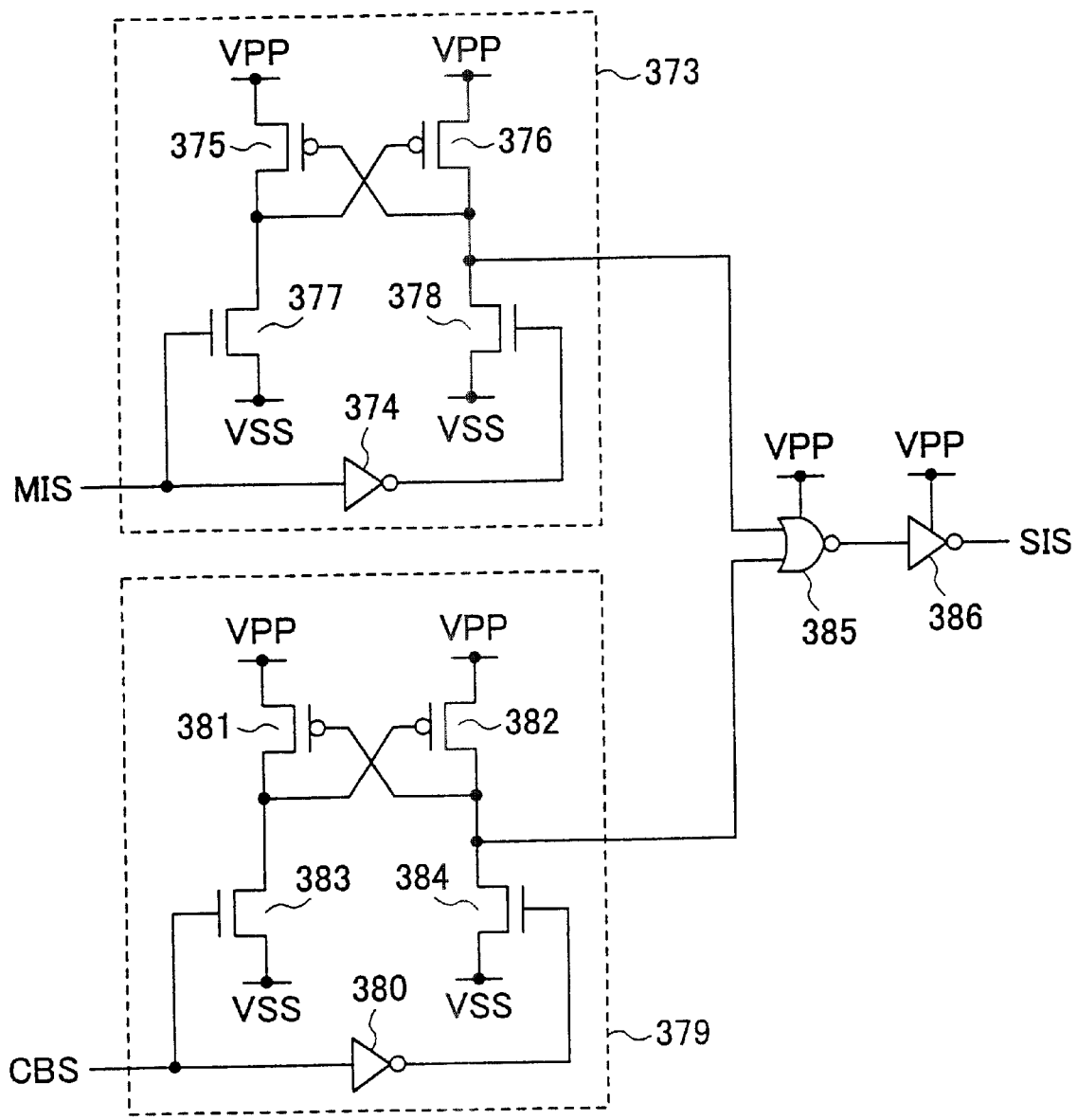
FIG. 11 is a circuit diagram of another circuit configuration of the sub isolation signal generating circuit employed in the first embodiment of the present invention.

FIG. 11 is a circuit diagram of another circuit configuration of the sub isolation signal generating circuit employed in the first embodiment of the present invention. The circuit includes a level conversion circuit 373 that's converts the level of the main isolation signal MIS into another level. The circuit 373 includes an inverter 374 inverting the main isolation signal MIS, PMOS transistors 375 and 376, and NMOS transistors 377 and 378. The inverter 374 has a CMOS structure that receives the power supply potential VII on the high-potential side and the ground potential VSS on the low-potential side. The sources of the PMOS transistors 375 and 376 are connected to the VPP line via which the boosted potential VPP is supplied.

A level conversion circuit 379 converts the level of the column block selection signal CBS, and includes an inverter 380 inverting the column block selection signal CBS, PMOS transistors 381 and 382, and NMOS transistors 383 and 384. The inverter 380 has a CMOS structure that receives the external power supply potential VII on the high-potential side and the ground potential VSS on the low-potential side. The sources of the PMOS transistors 381 and 382 are connected to the VPP line via which the boosted potential VPP is supplied.

A NOR circuit 385 performs a NOR operation on the outputs of the level conversion circuits 373 and 379. The NOR circuit 385 and the inverter 386 each have a CMOS structure that receives the boosted voltage VPP on the high-potential side and the ground potential VSS on the low-potential side.

When the isolation transistors are turned OFF by the sub isolation signal SIS, the main isolation signal MIS is set at VSS, and the column block selection signal CBS is set at VSS.

Thus, the level conversion circuit 373 operates as follows: the output of the inverter 374 is VII, the NMOS transistor 377 is OFF, the NMOS transistor 378 is ON, the PMOS transistor 375 is ON, the PMOS transistor 376 is OFF, and the output of the level conversion circuit 373 is VSS.

The level conversion circuit 379 operates as follows: the output of the inverter 380 is VII, the NMOS transistor 384 is ON, the NMOS transistor 383 is OFF, the PMOS transistor 382 is OFF, the PMOS transistor 389 is ON, and the output of the level conversion circuit 379 is VSS.

Thus, in the above case, the output of the NOR circuit 385 is VPP, the output of the inverter 386, namely, the sub isolation signal SIS is VSS. As a result, the isolation transistors controlled by the sub isolation signal are turned OFF.

In contrast, when the isolation transistors controlled by the sub isolation signal SIS are turned ON, the main isolation signal MIS is set at VII.

Thus, the level conversion circuit 373 operates as follows: the output of the inverter 374 is VSS, the NMOS transistor 377 is ON, the NMOS transistor 378 is OFF, the PMOS transistor 375 is OFF, the PMOS transistor 376 is ON, and the output of the level conversion circuit 373 becomes equal to VPP.

Thus, in this case, the output of the NOR circuit 385 becomes equal to VSS, and the output of the inverter 386, namely, the sub isolation signal SIS becomes equal to VPP. As a result, the isolation transistors controlled by the sub isolation signal SIS are turned ON.

As described above, according to the first embodiment of the present invention, only the high-potential-side potential of the sub isolation signal is set at the boosted potential VPP, while the high-potential-side potential of the main isolation signal is set at the step-down potential VII. It is therefore possible to reduce the number of signal lines that have the potential VPP on the high-potential side.

This results in reduction of consumption power of semiconductor devices that has the shared sense amplifier system and a hierarchical configuration in which the word drivers are hierarchically divided into the word drivers and sub word drivers and the isolation signal generating circuits are hierarchically divided into the main isolation signal generating circuits and the sub isolation signal generating circuits.

In a case where the boosted voltage VPP is needed for the potential of the bit line precharge signal PR on the high-potential side in the sub-isolation signal generating circuits configured as shown in FIG. 11, the sub isolation signal SIS can be used to generate the bit line precharge signal. The main isolation circuits may be configured so as to generate the main isolation signals that swing between the step-down potential VII obtained by stepping down the external power supply voltage VII and the ground potential VSS.

A description will be given, with reference to FIGS. 12 and 13, of a second embodiment of the present invention.

Figure 12:
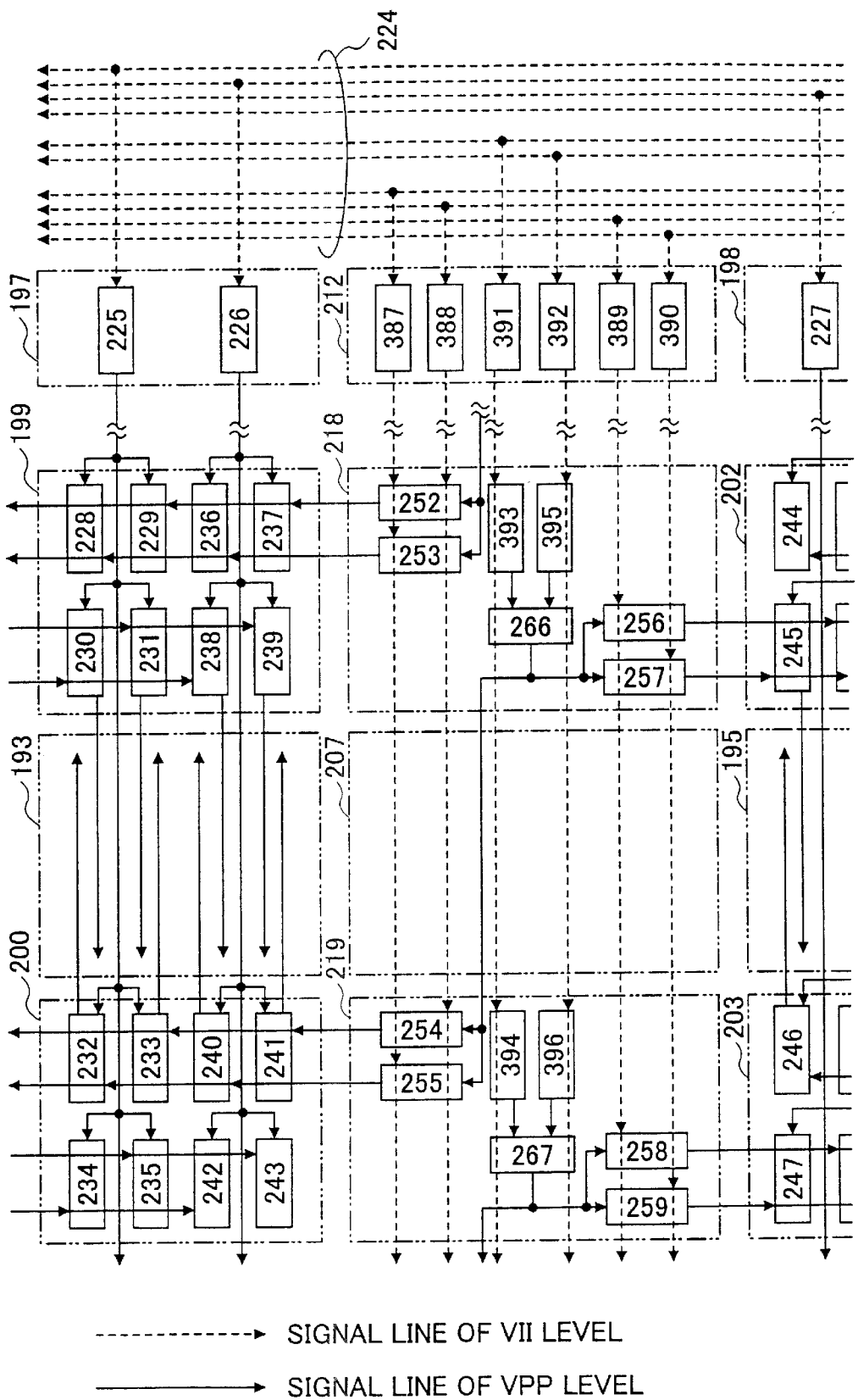
FIG. 12 is a circuit diagram of a part of a core part of a second embodiment of the present invention.

FIG. 12 is a circuit diagram of a part of a core part of the second embodiment of the present invention. In FIG. 12, main sub-word selection signal generating circuits 387–390 have a different circuit configuration from that of the main sub-word selection signal generating circuits 248–251 shown in FIG. 7. Main isolation signal generating circuits 391 and 392 have a different circuit configuration from that of the corresponding circuits 260 and 261 shown in FIG. 7. Sub isolation signal generating circuits 393–396 have a different circuit configuration from that of the corresponding circuits 262–265 shown in FIG. 7.

Figure 7:
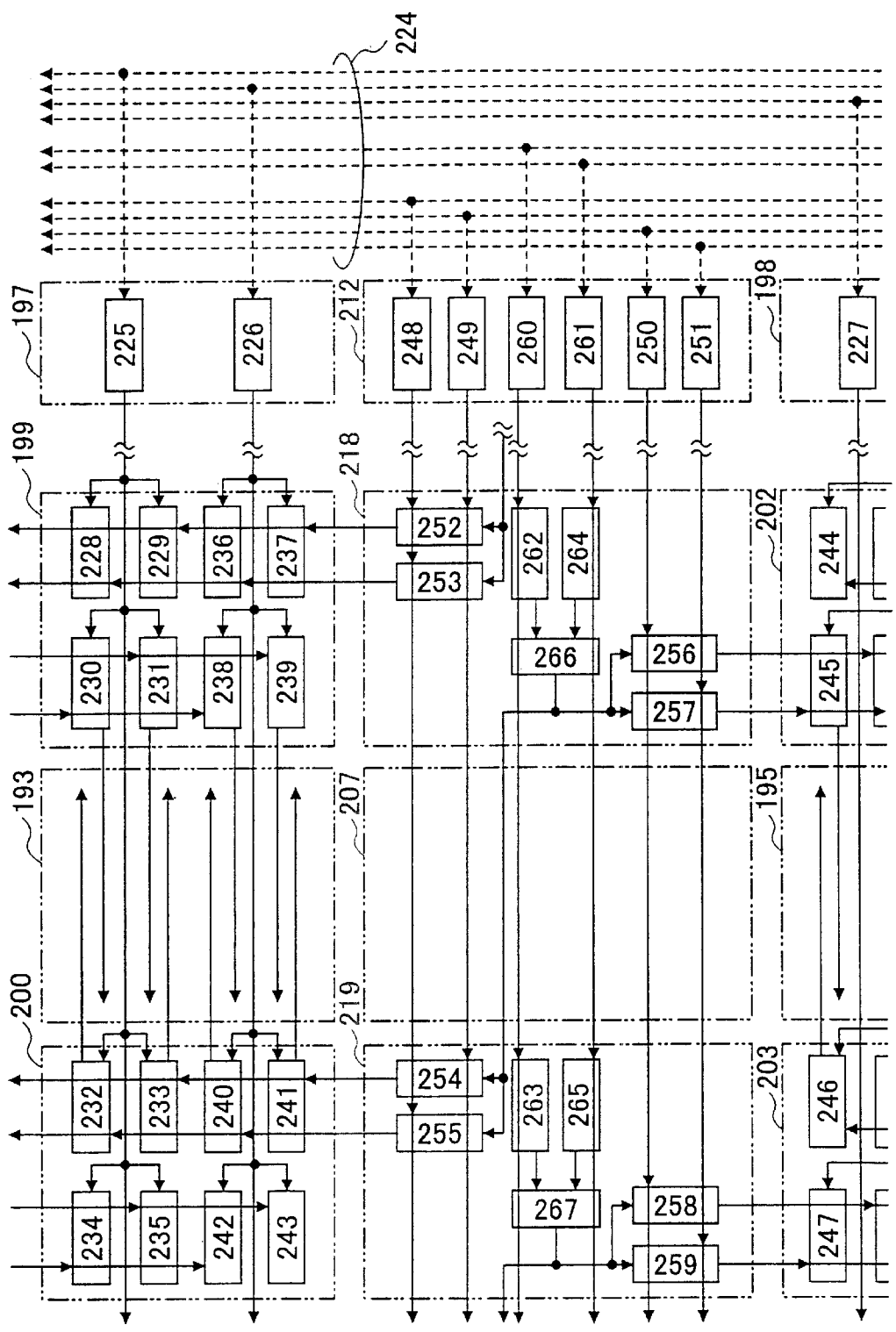
FIG. 7 is a circuit diagram of a part of the core part of the third conventional DRAM.

In short, the second embodiment of the present invention substitutes the main sub-word selection signal generating circuits 387–390, the main isolation signal generating circuits 391 and 392, and the sub isolation signal generating circuits 393–396 for the corresponding circuits shown in FIG. 7, while the other parts of the second embodiment are the same as those of the DRAM shown in FIG. 7.

In the second embodiment, the main sub-word selection signal generating circuits are configured so as to generate main sub-word selection signals that swing between the step-down potential VII on the high-potential side and the ground potential VSS on the low-potential side. The main isolation signal generating circuits are configured so as to generate main isolation signals that swing between the step-down potential VII on the high-potential side and the ground potential VSS on the low-potential side. The sub isolation signal generating circuits are configured so as to generate sub isolation signals that swing between the boosted potential VPP on the high-potential side and the ground potential VSS on the low-potential side in response to the main isolation signal that swings the step-down potential VII on the high-potential side and the ground potential VSS on the low-potential side.

Referring to FIG. 12, broken lines with arrows denote signal lines that carry signals that swing between the step-down potential VII on the high-potential side and the ground potential VSS on the low-potential side. Solid lines with arrows denote signals that carry signals that swing between the boosted potential VPP and the ground potential VSS.

More particularly, the signal lines swinging between the step-down potential VII and the ground potential VSS are used for the address signal lines 224, the main sub-word selection signal lines that are the output lines of the main sub-word selection signal generating circuits 387–390, and the main isolation signal lines that are the output lines of the main isolation signal generating circuits 391 and 392. The signal lines swinging between the boosted potential VPP and the ground potential are used for the main word lines that are the output lines of the main word drivers 225–227, the sub sub-word selection signal lines that are the output lines of the sub sub-word selection signal generating circuits 252–259, the sub isolation signal lines that are the output lines of the sub isolation signal generating circuits 393–396, and the bit-line precharge signal lines that are the output lines of the bit line precharge signal generating circuits 266 and 267.

Figure 8:
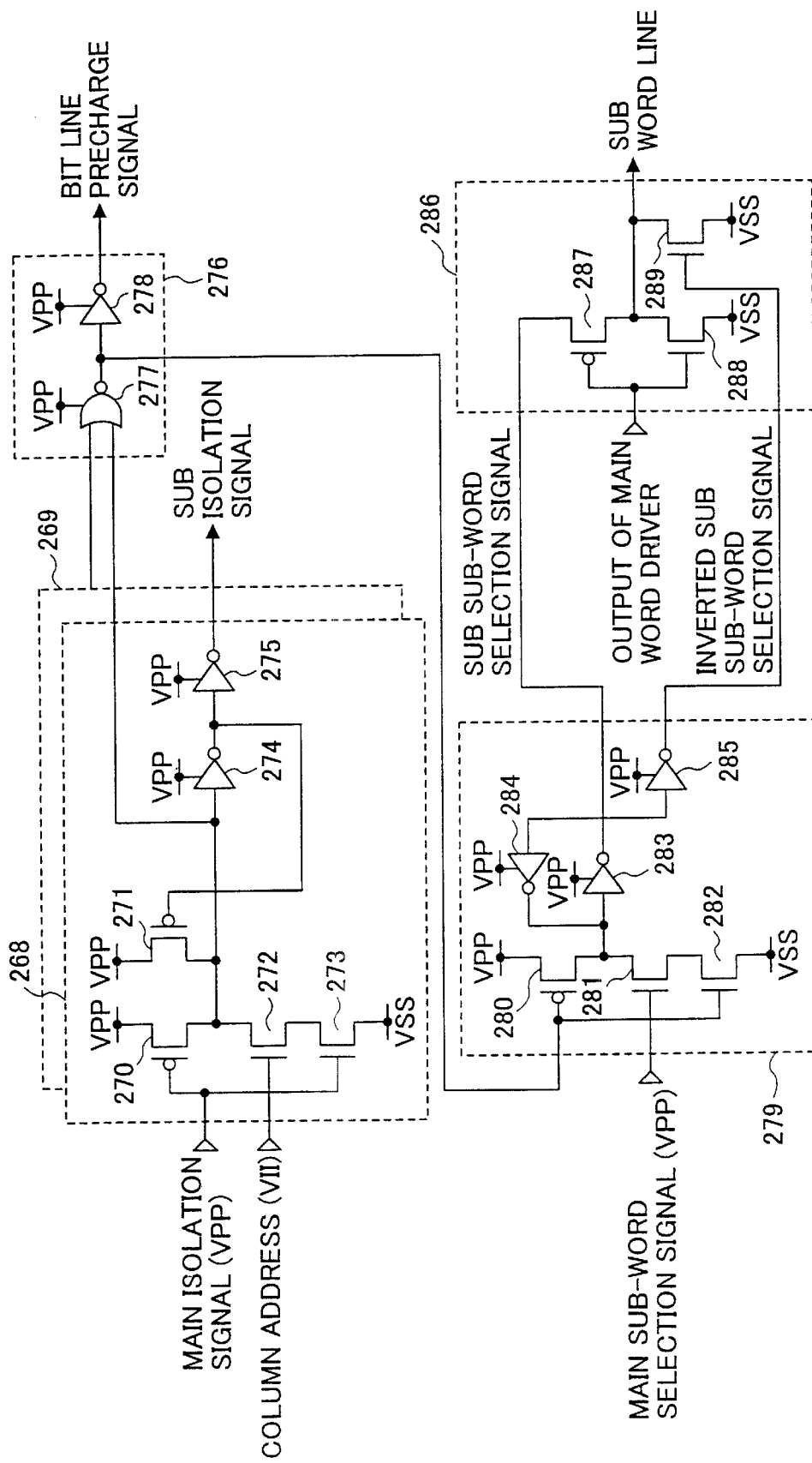
FIG. 8 is a circuit diagram of a circuit configuration arranged in an SS cross area of the core part of the third conventional DRAM.
Figure 13:
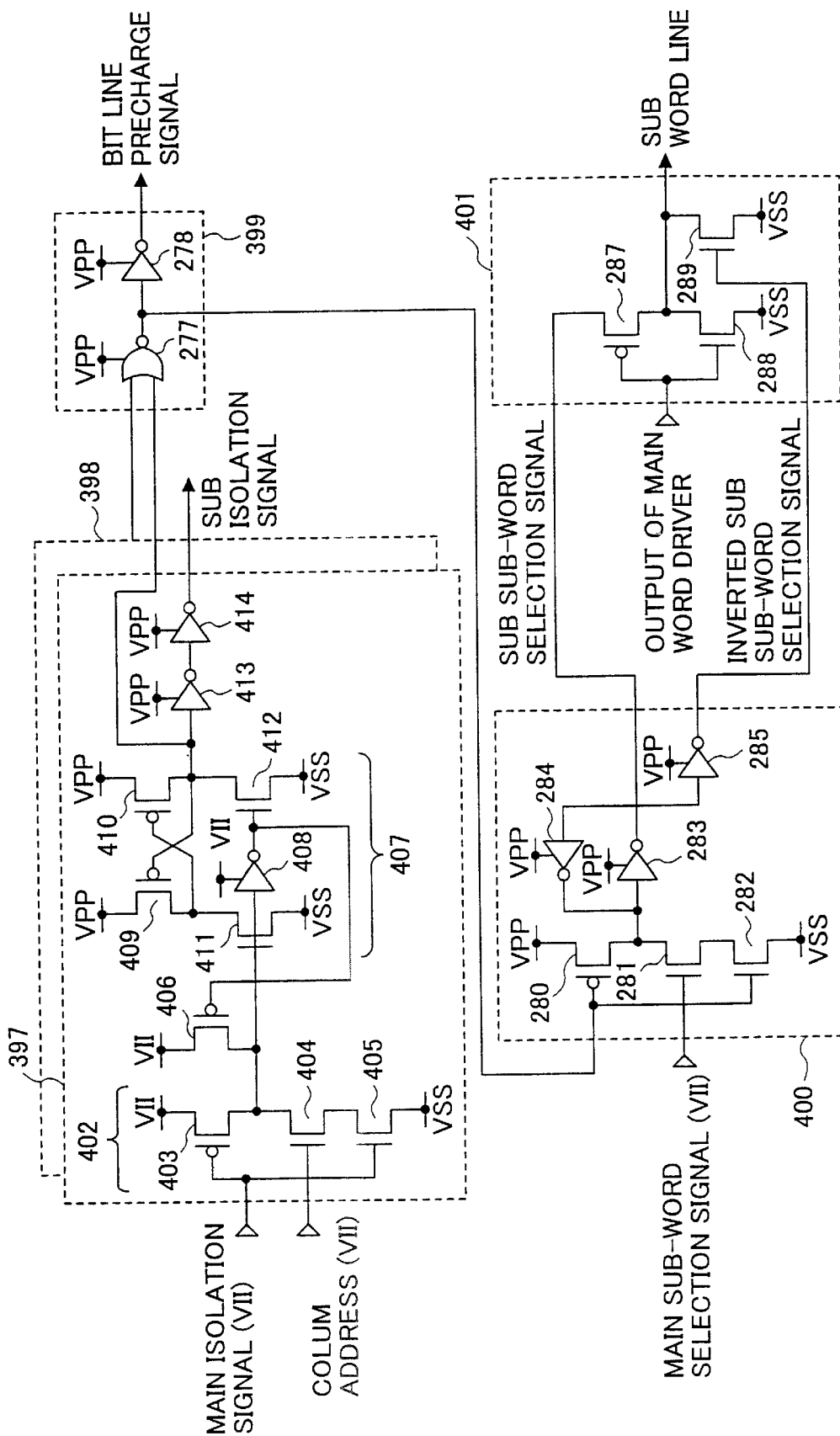
FIG. 13 is a circuit diagram of a circuit configuration arranged in an SS cross area of the core part of the second embodiment of the present invention.

FIG. 13 is a circuit diagram of a circuit arranged in the SS cross areas of the core part in the second embodiment of the present invention. The circuit includes sub isolation signal generating circuits 397 and 398, a bit line precharge signal generating circuit 399, a sub sub-word selection signal generating circuit 400, and a sub word driver 401. The bit line precharge signal generating circuit 399, the sub sub-word line signal generating circuit 400 and the sub word driver 401 are the same as the bit line precharge signal generating circuit 276, the sub sub-word selection signal generating circuit 279, and the sub word driver 286 shown in FIG. 8.

The sub isolation signal generating circuit 397 includes an input circuit part 402, which includes a PMOS transistor 403, and NMOS transistors 404 and 405. The input circuit part 402 operates with the step-down potential VII on the high-potential side and the ground potential VSS on the low-potential side. A PMOS transistor 406 serves as a level stabilization element, and the source thereof is connected to the VII line via which the step-down potential is supplied.

A level conversion circuit 407 converts the potential of the output of the input circuit part 402 on the high-potential side from the step-down potential VII to the boosted potential VPP. The circuit 407 includes an inverter 408 inverting the output of the input circuit part 402, PMOS transistors 409 and 410, and NMOS transistors 411 and 412. The inverter 408 operates with the step-down potential VII on the high-potential side and the ground potential VSS on the low-potential side. The sources of the PMOS transistors 409 and 410 are connected to the VPP line via which the boosted potential is supplied. Inverters 413 and 414 operate with the boosted potential VPP on the on the high-potential side and the ground potential on the low-potential side.

According to the second embodiment of the present invention, only the potential of the sub sub-word selection signals on the high-potential side is set at the boosted potential VPP, while the potential of the main sub-word selection signals on the high-potential side is set at the step-down potential. It is therefore possible to reduce the number of signal lines that have the boosted potential VPP on the high potential side.

This results in reduction of consumption power of semiconductor devices that has the shared sense amplifier system and a hierarchical configuration in which the word drivers are hierarchically divided into the word drivers and sub word drivers and the isolation signal generating circuits are hierarchically divided into the main isolation signal generating circuits and the sub isolation signal generating circuits.

What is claimed is:

1. A semiconductor memory device comprising:

main word drivers that drive word lines and are hierarchically divided into main word drivers and sub word drivers; and sub word selection signal generating circuits that select sub word lines and are hierarchically divided into main sub-word selection signal generating circuits and sub sub-word selection signal generating circuits, the sub sub-word selection signal generating circuits generating sub sub-word selection signals having a first potential on a high-potential side, the main sub-word selection signal generating circuits generating main sub-word selection signals having a second potential on the high-potential side, the second potential being lower than the first potential.

* * * * *

UNITED STATES PATENT AND TRADEMARK OFFICE
CERTIFICATE OF CORRECTION

PATENT NO. : 6,614,712 B2
DATED : September 2, 2003
INVENTOR(S) : Kota Hara et al.

It is certified that error appears in the above-identified patent and that said Letters Patent is hereby corrected as shown below:

<u>Title page,</u>
Item [75], Inventors, please change the listing of inventors tot read as follows:
-- Kota Haram, Kawasaju (JP); Shinya Fujioka, Kawasaki (JP) --.

Signed and Sealed this

Twentieth Day of January, 2004

JON W. DUDAS
*Acting Director of the United States Patent and Trademark Office*